United States Patent
Fan et al.

(10) Patent No.: US 7,570,121 B2
(45) Date of Patent: Aug. 4, 2009

(54) FREQUENCY JITTERING CONTROL CIRCUIT AND METHOD FOR USING THE SAME

(75) Inventors: Cheng-Hsuan Fan, Hsinchu (TW); Chao-Hsuan Chuang, Chupei (TW); Hung-Che Chou, Jiadong Township, Pingtung County (TW); Ching-Hsiang Yang, Taoyuan (TW); Chih-Ping Tan, Hsinchu (TW)

(73) Assignee: Richtek Technology Corporation, Hsin-Chu (TW)

( * ) Notice: Subject to any disclaimer, the term of this patent is extended or adjusted under 35 U.S.C. 154(b) by 136 days.

(21) Appl. No.: 11/821,498

(22) Filed: Jun. 25, 2007

(65) Prior Publication Data

US 2008/0224782 A1 Sep. 18, 2008

(30) Foreign Application Priority Data

Mar. 14, 2007 (TW) .............................. 96108816 A

(51) Int. Cl.
*H03L 7/00* (2006.01)
(52) U.S. Cl. .............................................. 331/2; 331/49
(58) Field of Classification Search ..................... 331/2, 331/49, 60, 111, 143
See application file for complete search history.

(56) References Cited

U.S. PATENT DOCUMENTS 5,235,292 A * 8/1993 Endo et al. ..................... 331/49
7,184,283 B2 * 2/2007 Yang et al. ..................... 363/41

* cited by examiner

*Primary Examiner*—Daniel D Chang
(74) *Attorney, Agent, or Firm*—Tung & Associates

(57) ABSTRACT

A frequency jittering control circuit wherein by means of the characteristics of a PLL whose input switches between different frequencies, the output frequency of the PLL swings between the different frequencies to achieve the desired frequency jittering.

11 Claims, 4 Drawing Sheets

FREQUENCY JITTERING CONTROL CIRCUIT AND METHOD FOR USING THE SAME

FIELD OF THE INVENTION

The present invention relates to a frequency jittering control circuit and a method for using the same, in particular to a frequency jittering control circuit and a method which do not require a digital counter. The omission of the digital counter greatly reduces the complexity of the circuit.

BACKGROUND OF THE INVENTION

To avoid electromagnetic interference (EMI) generated by high frequency signals, frequency jittering is a method that is often used in high frequency electronic products. Conventionally, frequency jittering is achieved by means of a digital counter; following the counts generated by the digital counter, the frequency shifts within a narrow range. The digital counter may be designed to provide sequential or random counts, and the frequency correspondingly shifts sequentially or randomly. A typical frequency jittering control circuit employing a digital counter may be found in U.S. Pat. No. 6,229,366.

The drawbacks to use a digital counter are as follows: first, a digital counter is a huge circuit device; it is made of T flip-flops, and T flip-flops heavily consume circuit area. Moreover, in such frequency jittering control circuits, a designer has to design current source devices of different current amounts, and the corresponding control mechanism of the different current source devices by the output of the digital counter. Thus, the conventional circuit employing a digital counter is disadvantageous in that it is costly and complicated.

SUMMARY OF THE INVENTION

In view of the foregoing, it is an objective of the present invention to provide a frequency jittering control circuit and a method thereof, which do not require a digital counter. The present invention takes advantage of the characteristics of a phase lock loop (PLL) in a very inventive way; by switching the input frequency of the PLL, the output frequency of the PLL swings between two frequency limits to provide the desired frequency jittering function. Moreover, the resulted frequency after frequency jittering is more random and smoother, providing a better anti-EMI effect than that resulting from conventional random counts by a digital counter.

In accordance with the foregoing and other objectives of the present invention, and as disclosed by one embodiment of the present invention, a frequency jittering control circuit is disclosed, which comprises: at least two oscillators generating different reference frequencies; and a PLL having an input switching between the at least two oscillators.

As disclosed by another embodiment of the present invention, a frequency jittering control circuit is disclosed, which comprises: a multi-frequency oscillator generating at least two different reference frequencies; and a PLL having an input switching between the at least two reference frequencies.

According to another aspect of the present invention, a frequency jittering control method is disclosed, which comprises: generating at least two different frequencies, and providing a PLL having an input switching between the at least two reference frequencies so that its output swings between the at least two reference frequencies.

It is to be understood that both the foregoing general description and the following detailed description are provided as examples, for illustration rather than limiting the scope of the invention.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Figure 1:
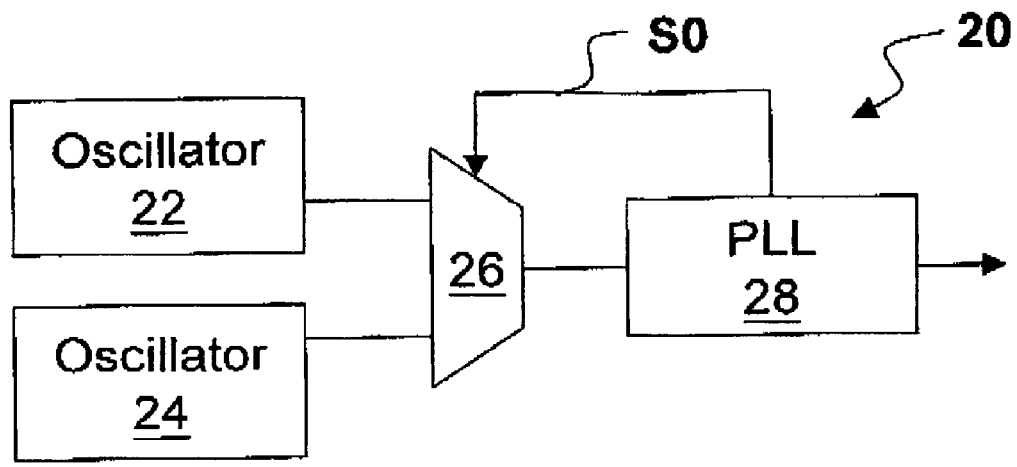
FIG. 1 is a schematic diagram showing a first embodiment of the present invention.

The present invention takes advantage of the characteristics of a PLL in an inventive way. FIG. 1 is a schematic circuit diagram illustrating a first embodiment of the present invention. As shown in the figure, according to the present embodiment, a frequency jittering control circuit 20 includes two oscillators 22 and 24, which generate two different reference frequencies respectively. A multiplexer 26 receives the outputs from the two oscillators 22 and 24, and selects one of them. The output of the multiplexer 26 is electrically connected with the input of the PLL 28, and thus the PLL 28 will gradually adjust its output frequency to be consistent with the output frequency of the multiplexer 26.

The circuit shown in FIG. 1 operates as follows. At first, a user may set the reference frequencies of the two oscillators 22 and 24 as the upper and lower limits of the range for frequency jittering. The PLL 28 may start from any frequency, and the multiplexer 26 may start by selecting anyone of its inputs. When or after the PLL 28 synchronizes its output frequency to the output frequency of the multiplexer 26, a signal S0 is generated to switch the multiplexer 26 to the other frequency input. Due to the phase lock function of the PLL 28, the output frequency of the PLL 28 will gradually increase or decrease, until it again synchronizes its output frequency to the output frequency of the multiplexer 26. At or after this time point, the PLL 28 again sends a signal S0 to switch the multiplexer 26 to the other frequency input. As such, the output frequency of the PLL 28 will swing between the upper and lower limits of the range, achieving the frequency jittering function.

In comparison with the conventional frequency jittering method by means of a digital counter, the frequency spectrum of the present invention is smoother. The time point when the signal S0 is generated could be any point in the waveform of the other frequency, and thus the swing is more random, providing a better anti-EMI effect.

The above embodiment employs two oscillators with two different reference frequencies. Under the same spirit, it can be readily conceived to use more than two oscillators for the multiplexer 26 to switch among the different inputs. Here it should be emphasized that it is also possible to use only one oscillator, to generate two or more reference frequencies.

Figure 2:
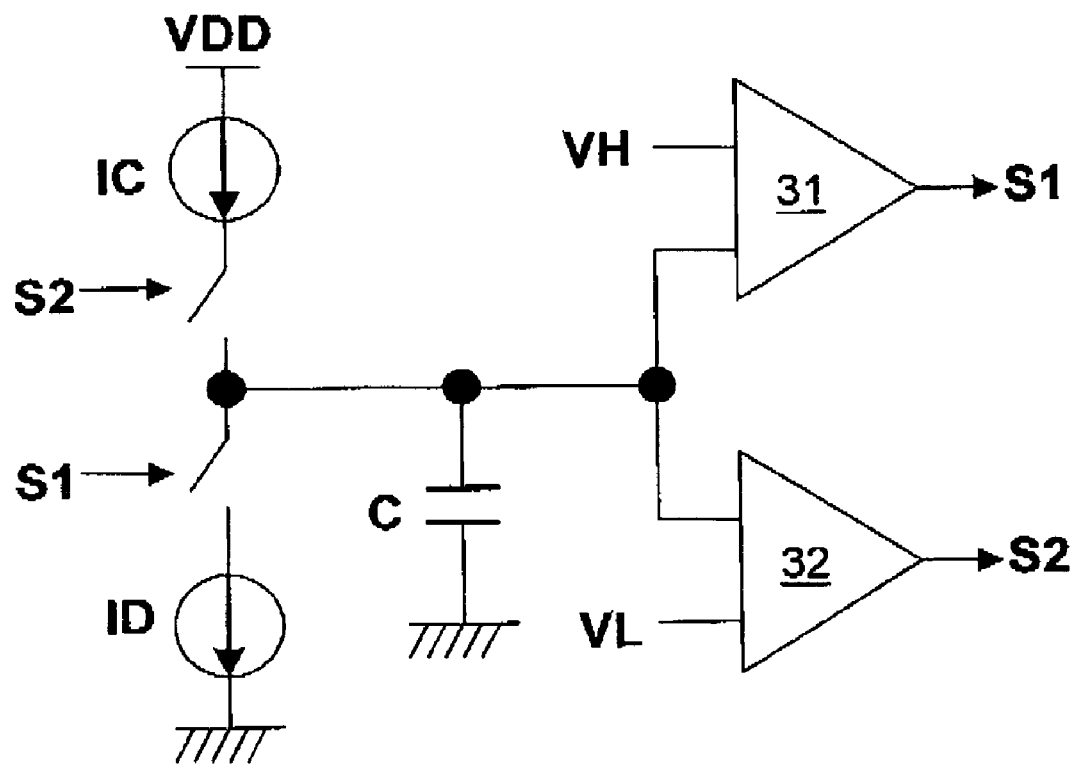
FIG. 2 is a circuit diagram showing a typical structure of an oscillator.
Figure 3:
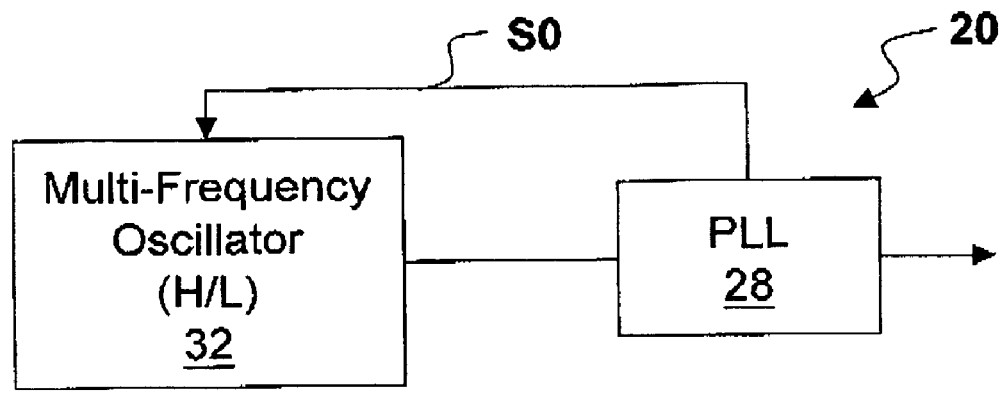
FIG. 3 is a schematic diagram showing a second embodiment of the present invention.

FIG. 2 shows a typical structure of an oscillator. It works as follows. The signal S2 or S1 decides whether the circuit charges the capacitor C by the charging current source IC, or discharges the capacitor C by the discharging current source ID. The voltage across the capacitor C is compared with a high-level input VH of a high-level comparator 31 to generate the signal S1, and compared with a low-level input VL of a low-level comparator 32 to generate the signal S2. The charging and discharging of the capacitor C generate oscillation signals.

Figure 4A:
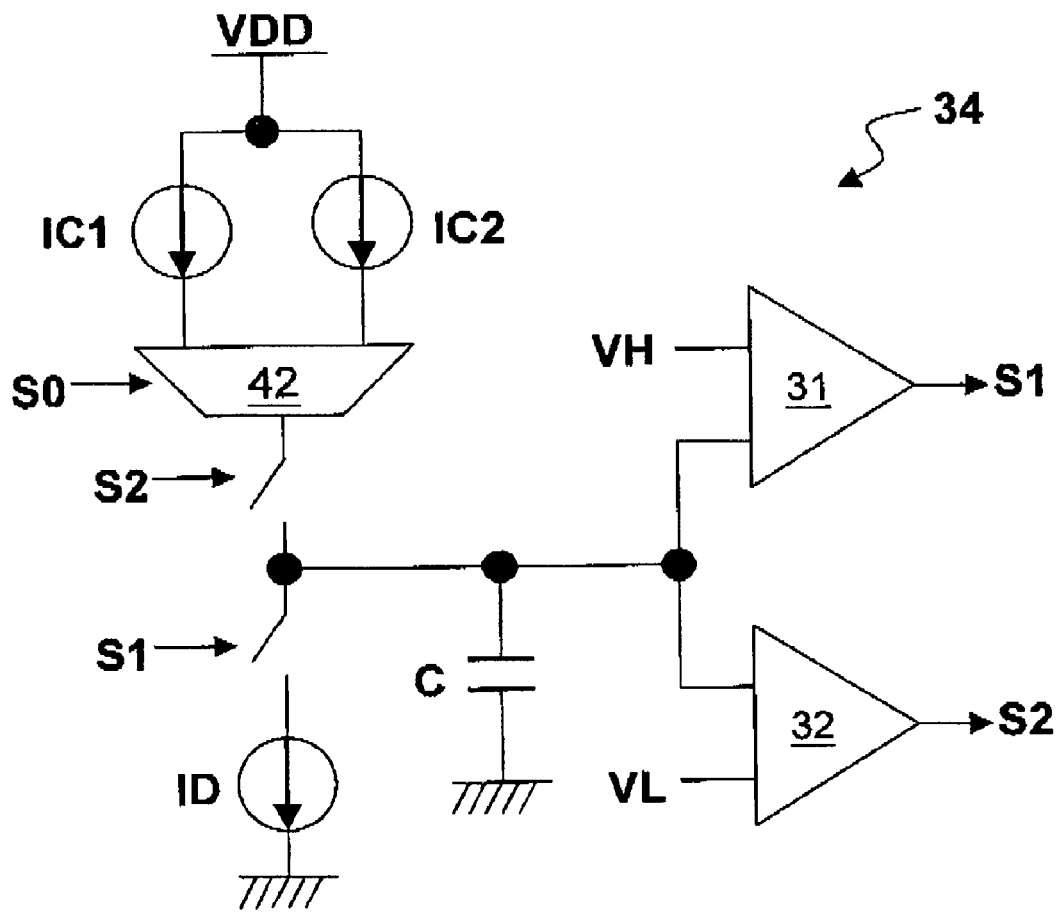
FIGS. 4A-4E show five embodiments of the multi-frequency oscillator according to the present invention.
Figure 4B:
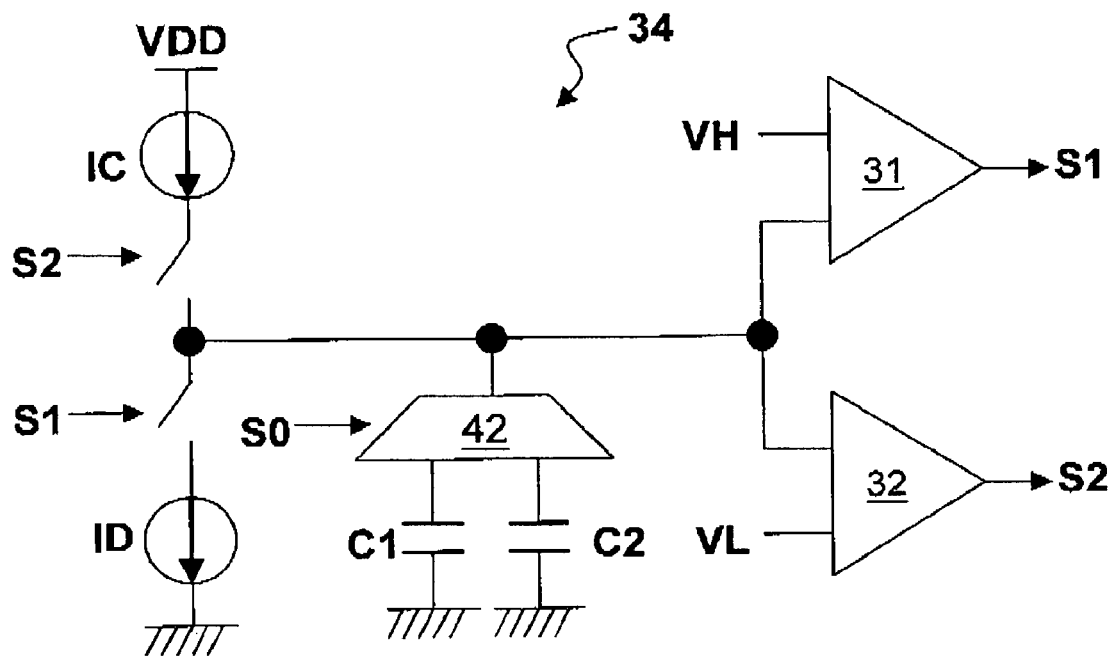
Figure 4C:
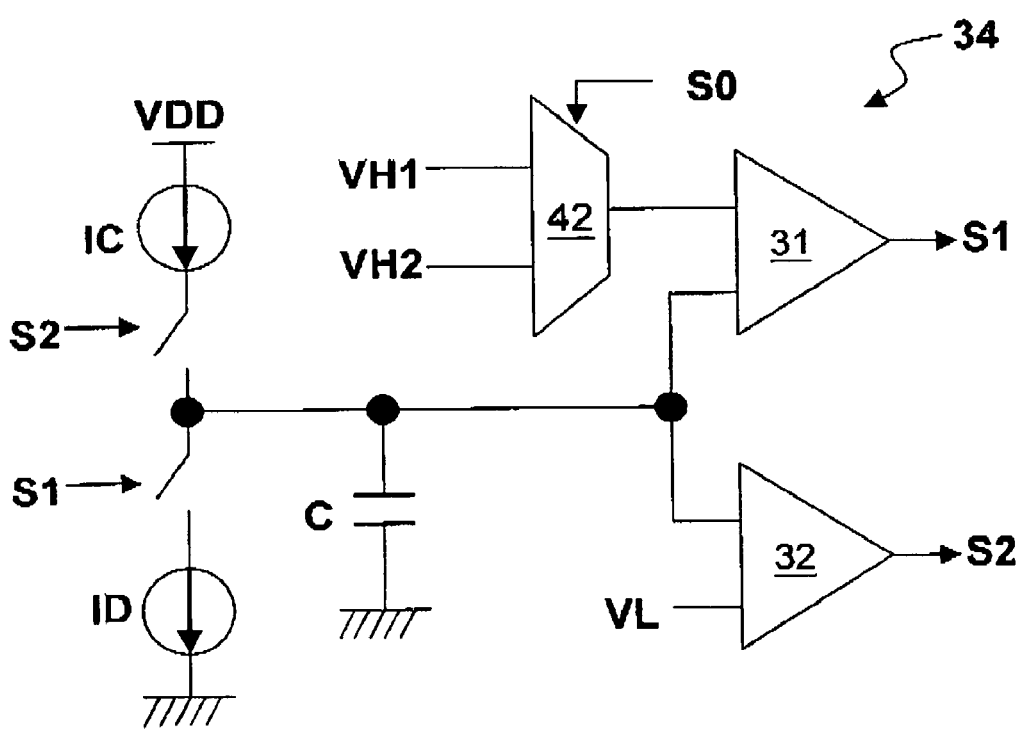
Figure 4D:
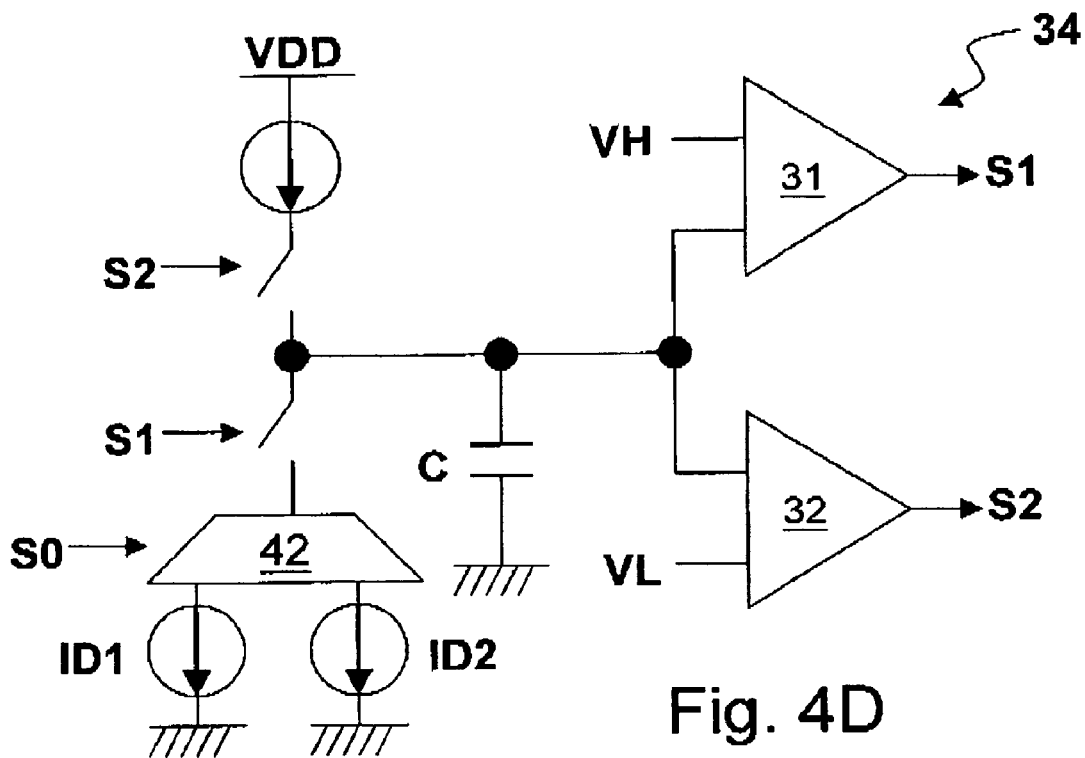

"Referring to FIG. 3 and FIGS. 4A-4E, a multifrequency oscillator 32 can be made by slightly modifying the circuit shown in FIG. 2. As a first example (FIG. 4A), the multi-frequency oscillator 32 is provided with two charging current sources IC1 and IC2 of different current amounts, and the signal S0 sent by the PLL 28 controls a multiplexer 42 to switch between the two charging current sources IC1 and IC2. By this arrangement, the output of the PLL 28 also achieves the desired frequency jittering function. By the same token, similar effect can be achieved by providing two discharging current sources, as shown in FIG. 4D."

Figure 4E:
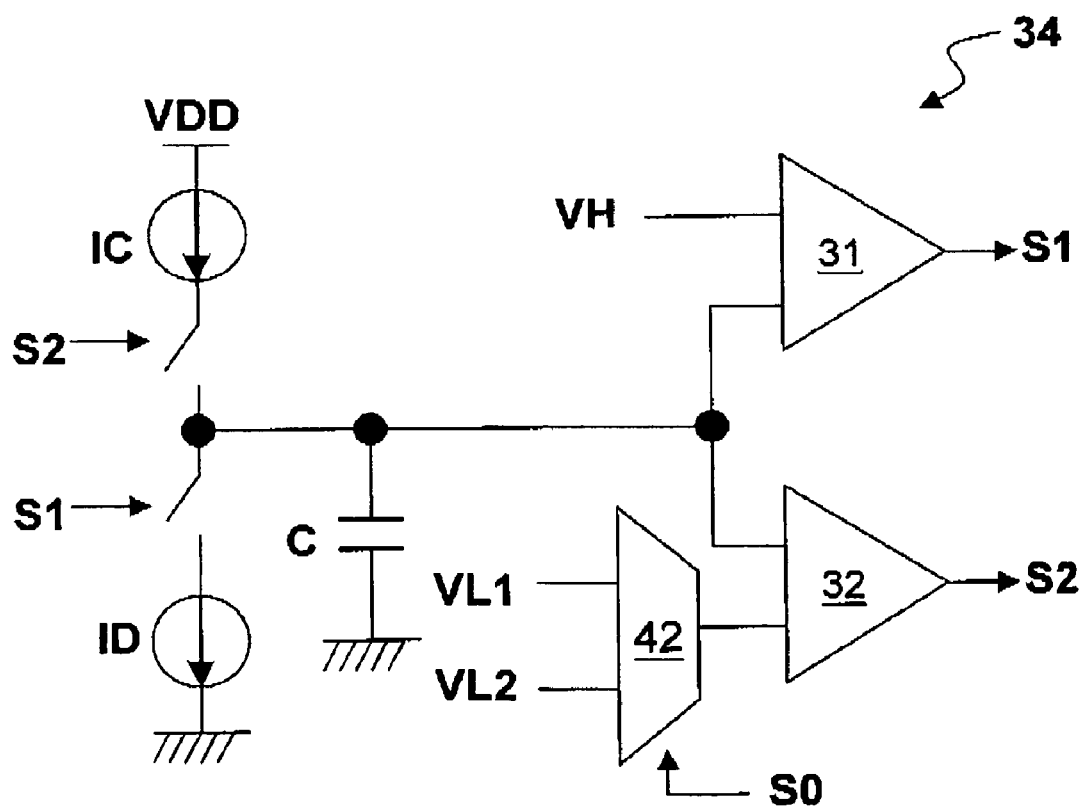

"As another example, referring to FIG. 4B, the multi-frequency oscillator 32 is provided with two capacitors C1 and C2 of different capacitances, and the signal S0 sent by the PLL 28 controls a multiplexer 42 to switch between the two capacitors C1 and C2. As yet another example, referring to Fig. 4C, the multi-frequency oscillator 32 is provided with two high-level reference voltage inputs VH1 and VH2, and the signal S0 sent by the PLL 28 controls a multiplexer 42 to switch between the two inputs VH1 and VH2. (By the same token, the multi-frequency oscillator 32 can be provided with two low-level reference voltage inputs, as shown in FIG. 4E.) All the above arrangements can construct a multi-frequency oscillator 32 that is able to cause the PIJL 28 to swing between an upper and a lower limits of a preset range, achieving the desired frequency jittering function more smoothly and more randomly than prior art."

Although the present invention has been described in considerable detail with reference to certain preferred embodiments thereof, they are for illustrative purpose rather than for limiting the scope of the present invention. Other variations and modifications are possible. For example, one may insert circuit devices which do not affect the primary function of the circuit between two of the illustrated devices. In view of the foregoing, it is intended that the present invention cover all such modifications and variations, which should be interpreted to fall within the scope of the following claims and their equivalents.

What is claimed is:

1. A frequency jittering control circuit, comprising:
   at least two oscillators generating different reference frequencies, wherein one of the oscillators provides an upper frequency limit and another of the oscillators provides a lower frequency limit; and
   a phase lock loop (PLL) having an input switching between the at least two oscillators, so that the PLL provides an output jittering between the upper and lower frequency limits.

2. The frequency jittering control circuit of claim 1, further comprising a multiplexer for selecting one of the at least two oscillators, wherein when or after the PLL synchronizes its output frequency to the frequency of its input, it generates a signal to switch the multiplexer to select another of the at least two oscillators.

3. A frequency jittering control circuit, comprising:
   a multi-frequency oscillator generating at least two different reference frequencies, wherein one of the reference frequencies defines an upper frequency limit and another of the reference frequencies defines a lower frequency limit; and
   a phase lock loop (PLL) having an input switching between the at least two reference frequencies, so that the PLL provides an output jittering between the upper and lower frequency limits.

4. The frequency jittering control circuit of claim 3, wherein the multifrequency oscillator comprises:
   at least two charging current sources;
   a discharging current source;
   a capacitor switching among the modes wherein it is charged by one of the at least two charging current sources, or discharged by the discharging current source;
   a high-level comparator comparing the voltage across the capacitor with a highlevel reference voltage; and
   a low-level comparator comparing the voltage across the capacitor with a lowlevel reference voltage.

5. The frequency uttering control circuit of claim 3, wherein the multi-frequency oscillator comprises:
   a charging current source;
   at least two discharging current sources;
   a capacitor switching among the modes wherein it is charged by the charging current source, or discharged by one of the at least two discharging current sources;
   a high-level comparator comparing the voltage across the capacitor with a high-level reference voltage; and
   a low-level comparator comparing the voltage across the capacitor with a low-level reference voltage.

6. The frequency jittering control circuit of claim 3, wherein the multi-frequency oscillator comprises:
   a charging current source;
   a discharging current source;
   at least two capacitors respectively switching among the modes wherein it is charged by the charging current source, or discharged by the discharging current source;
   a high-level comparator selectively comparing the voltage across one of the capacitors with a high-level reference voltage; and
   a low-level comparator selectively comparing the voltage across one of the capacitors with a low-level reference voltage.

7. The frequency jittering control circuit of claim 3, wherein the multi-frequency oscillator comprises:
   a charging current source;
   a discharging current source;
   a capacitor switching among the modes wherein it is charged by the charging current source, or discharged by the discharging current source;
   a high-level comparator selectively receiving one of at least two high-level reference voltage inputs and comparing the voltage across the capacitor with the selected high-level reference voltage input; and
   a low-level comparator comparing the voltage across the capacitor with a low-level reference voltage.

8. The frequency jittering control circuit of claim 3, wherein the multi-frequency oscillator comprises:
   a charging current source;
   a discharging current source;
   a capacitor switching among the modes wherein it is charged by the charging current source, or discharged by the discharging current source;
   a high-level comparator comparing the voltage across the capacitor with a high-level reference voltage input; and
   a low-level comparator selectively receiving one of at least two low-level reference voltage inputs and comparing the voltage across the capacitor with the selected low-level reference voltage input.

9. A frequency jittering control method comprising the steps of:
  (A) generating at least two different frequencies, wherein one of the reference frequencies defines an upper frequency limit and another of the reference frequencies defines a lower frequency limit; and
  (B) providing a phase lock loop (PLL) having an input switching between the at least two reference frequencies so that its output swings between the upper and lower frequency limits.

10. The frequency jittering control method of claim 9, wherein the step (A) includes: generating the different frequencies by oscillators of correspondingly different frequencies.

11. The frequency jittering control method of claim 9, wherein the step (A) includes: generating the different frequencies by a multi-frequency oscillator.

* * * * *